Jan. 18, 1966 J. J. AMODEI 3,230,393

SEQUENTIAL SWITCHING CIRCUIT WHICH EMPLOYS THE TURN-OFF DELAY OF A SATURATED TRANSISTOR FOR INTERIM STORAGE

Filed June 7, 1963 2 Sheets-Sheet 1

INVENTOR.
JUAN J. AMODEI

BY John V. Regan

Attorney

INVENTOR
JUAN J. AMODEI
BY John V. Regan
Attorney

United States Patent Office 3,230,393
Patented Jan. 18, 1966

3,230,393

SEQUENTIAL SWITCHING CIRCUIT WHICH EMPLOYS THE TURN-OFF DELAY OF A SATURATED TRANSISTOR FOR INTERIM STORAGE

Juan J. Amodei, Levittown, Pa., assignor to Radio Corporation of America, a corporation of Delaware Filed June 7, 1963, Ser. No. 286,342
7 Claims. (Cl. 307—88.5)

This invention relates to sequential switching circuits and, in particular, though not exclusively, to sequentially operative counter means.

A sequential counter may be defined as one comprising a plurality of bistable stages connected in cascade, characterized in that not more than one stage is in the "on" state at any time, and each externally applied pulse turns off the stage that was "on" and turns "on" the next stage in the cascaded chain. A stage in the "on" state may be considered as being "set" and storing a binary "1." A ring counter is one example of a sequential counter. Sequential counters are useful, for example, as event counters, scalers, and the like, and have application in conjunction with shift registers for counting the number of shift pulses applied to a shift register.

In order to have counting operation, a means for transferring a stored signal in response to the externally applied pulse is provided. When dynamic readout is employed for transfer, the presence or absence of a change in state is used to determine the prior operating state of a stage. This method has the advantage of generating the transfer signal only in response to an applied external pulse, thereby eliminating the need for interstage gating to prevent undesired transfer during the storage portion of the operating cycle.

A differentiating capacitor in the interstage coupling link achieves this result by producing a current pulse when a stage storing a "1" is reset. To achieve proper transfer, this current pulse should either be of sufficient amplitude to override the external pulse applied to the next stage, which is generally impractical due to the large current required, or else the current pulse should still be present after the termination of the external pulse. According to the invention, advantage is taken of the turn-off time, including the saturation delay time and fall time, of a saturated transistor to provide reliable information transfer.

It is one object of the invention to provide a sequential switching circuit which employs dynamic readout for information transfer.

It is another object of this invention to provide a sequential switching arrangement in which each stage includes a hybrid transistor-negative resistance diode bistable circuit.

It is a further object of this invention to provide a sequential counter in which advantage is taken of the turn-off time of a saturated transistor to insure reliable dynamic readout and reliable information transfer between stages.

Briefly stated, a sequential counter according to the invention comprises a plurality of bistable stages connected in cascade. Each stage includes a negative resistance diode connected between the emitter and base of a transistor and biased bistably in such a manner that the transistor is in saturation when the diode is in the first of its two stable states. A separate capacitor is connected between the collector of the transistor in each stage and the base of the transistor in the next succeeding stage. Information is transferred by applying to each of the diodes a pulse having a polarity to switch any diode operating in the first state to the second stable state, and having a duration which is shorter than the turn-off time of each of the transistors.

In the accompanying drawing, like reference characters denote like components, and:

Figure 1:
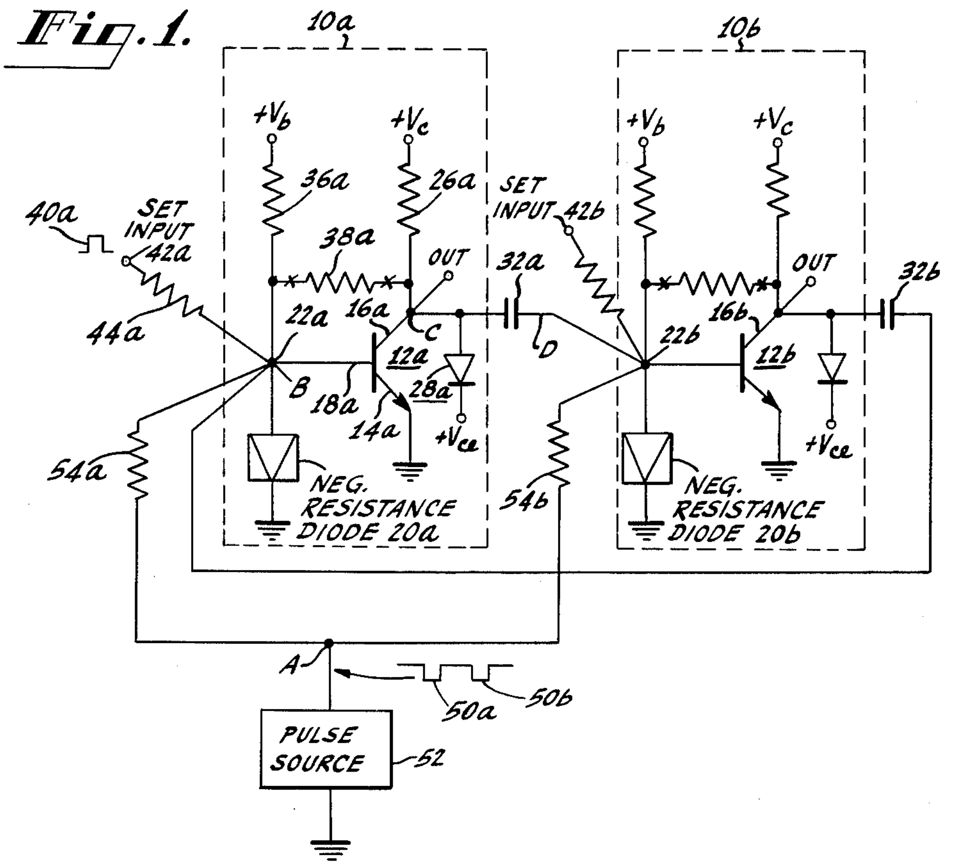
FIGURE 1 is a schematic diagram of a two stage sequential switching circuit embodying the invention.

A two stage ring counter is illustrated schematically in FIGURE 1. The two stages are contained within dashed boxes 10*a* and 10*b* and are physically alike. Accordingly, only the first stage 10*a* will be described in detail. Components in, and associated with, stage 10*a* are designated by reference numerals followed by the letter "*a*," and like components in, and associated with, the second stage 10*b* are designated by like reference numerals followed by the letter "*b*." Although only two stages are shown by way of example, any number of stages may be employed as requirements dictate.

The first stage 10*a* comprises a transistor 12*a*, illustrated as NPN type, connected in the ground emitter configuration by connecting the emitter electrode 14*a* directly to a point of reference potential, illustrated by the conventional symbol for circuit ground. A negative resistance diode 20*a*, which is preferably a tunnel diode, has its cathode connected to ground and its anode connected to a junction 22*a* at the base 18*a*. A collector resistor 26*a* is connected between the collector 16*a* and a point of positive voltage, designated $+V_c$. This positive voltage, and the positive voltages $V_b$ and $V_{c1}$, to be mentioned, may be provided by batteries (not shown) which have their positive terminals connected to the correspondingly labeled voltage points and which have their negative terminals connected to circuit ground. A diode 28*a* is poled to clamp the collector 16*a* voltage at approximately $+V_{c1}$ volts when the transistor 12*a* is nonconducting. Voltage changes at the collector 16*a* are applied to the junction 22*b* of second stage 10*b* by way of a differentiating capacitor 32*a*. Differentiation is provided by the combination of capacitor 32*a* and the low impedance from junction 22*b* to ground, primarily the low impedance of negative resistance diode 20*b*.

Current for biasing the negative resistance diode 20*a* is supplied from the $+V_b$ voltage source by way of a resistor 36*a*, which is chosen in value so that the combination of the resistor 36*a* and the voltage source serves as a current source of substantially constant current. Additional bias current may be supplied to the diode 20*a* from the $+V_c$ voltage source by connecting a resistor 38*a* between the points marked "X" common to the collector 16*a* and the junction 22*a*. The conditions under which it may be desirable to employ the resistor 38*a* will be described more fully hereinafter. Suffice it to say at this point that the bias current is chosen so that the diode 20*a* is biased bistably in such a manner that the transistor 12*a* is biased into saturation when the negative resistance diode 20*a* is in a first stable state of high voltage, which may be designated the "set" state. The small voltage across the diode 20*a* is not sufficient to turn on the transistor 12*a* when the diode 20*a* is in the second stable state, or "reset" state.

Positive input signals 40*a* may be applied at an input terminal 42*a* and coupled to the junction 22*a* by way of a resistor 44*a* for switching the negative resistance diode 20*a* from the reset to the set state. Other input signals may be applied at the junction 22*a*, for example, by way of the differentiating capacitor 32*b* from the collector 16*b* in the second stage 10*b*. Pulses 50*a* for resetting the negative resistance diodes 20*a* and 20*b* are supplied by a pulse source 52 by way of resistors 54*a*, 54*b*, respectively. These pulses 50*a*, for reasons to be described, have an amplitude and polarity to switch any negative resistance diode 20*a*, 20*b* from the set to the reset state, and a duration which is shorter than the turn-off time of the transistors 12*a* and 12*b*.

Figure 2:
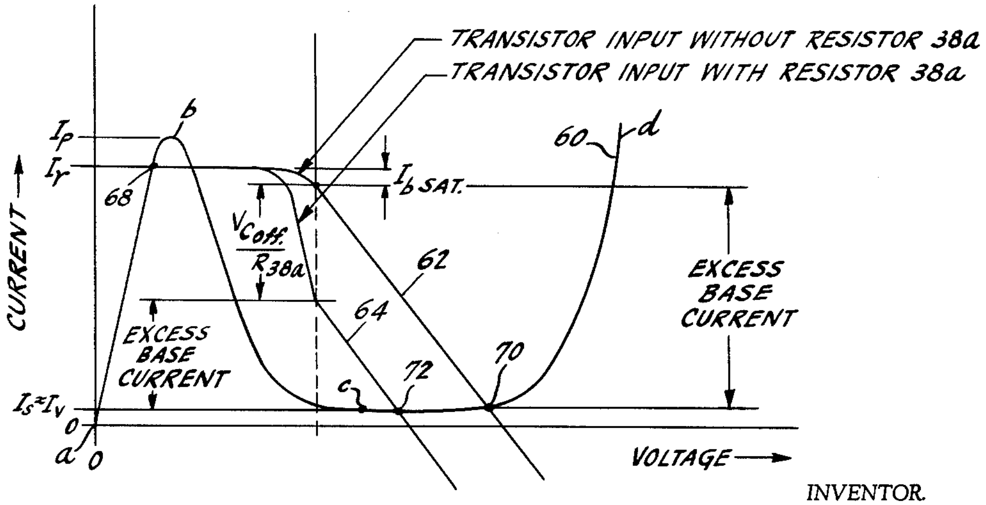
FIGURE 2 is a set of static volt-ampere operating characteristics useful in describing the operation of the sequential circuit of FIGURE 1.

The basic operation of the negative resistance diode 20*a*-transistor 12*a* combination as a bistable device will now be described with particular reference to FIGURE 2. In FIGURE 2, voltage is plotted along the abscissa and current is plotted along the ordinate. The curve 60 is a volt-ampere characteristic of a tunnel diode, which is preferred as the negative resistance diode. Other types of negative resistance diodes having suitable characteristics also may be used, and the characteristics of such devices may vary somewhat in shape and voltage and current range from the characteristic 60 illustrated. In general, it may be said that a suitable type of negative resistance diode is one which has a first positive resistance region *ab* at low voltage, a second positive resistance region *cd* at high voltage, relatively speaking, and a region *bc* of negative resistance joining the two positive resistance regions. In one type of tunnel diode, the voltage corresponding to the peak *b* is about 20 millivolts, which is less than the voltage required to bias the transistor 12*a* into conduction.

Two static load lines 62 and 64 are illustrated in FIGURE 2. Load line 62 represents the load seen by the tunnel diode 20*a* when the resistor 38*a* is omitted from the FIGURE 1 circuit. The other load line 64 includes the effect of this resistor 38*a*. Consider first the operation of a bistable stage without resistor 38*a*. The voltage $+V_b$ and the value of resistor 36*a* in the current source are chosen so that the current source supplies a substantially constant current $I_r$ at the junction 22*a*. Preferably, the circuit $I_r$ is chosen as close to the peak current $I_b$ as tolerances permit. The load line 62 is substantially horizontal in the low voltage region because the transistor 12*a* is nonconducting and draws little or no base current. The sloping portion of the load line 62 represents the load seen looking into the base 18*a* of the transistor 12*a* when the transistor is conducting.

Load line 62 intersects the operating characteristic 60 at points 68 and 70 in the first and second positive resistance regions, respectively. These points 68, 70 are stable operating points and define the current and voltage values of the diode 20*a* for the two stable states. The tunnel diode is in the reset state when the diode is biased at operating point 68. The voltage corresponding to point 68 is about 20 millivolts, whereby transistor 12*a* is nonconducting. Thus, all of the current $I_r$ flows into the tunnel diode. When a positive pulse is applied at the junction 22*a*, the diode 20*a* current increases and the load line 62 shifts in a vertical direction. If the diode current exceeds the peak value $I_p$, the diode 20*a* is switched rapidly through its negative resistance region and, at the termination of the pulse, the circuit stabilizes to the operating point 70 of high voltage. The tunel diode 20*a* then is stably biased in the set state. The diode 20*a* in the FIGURE 1 circuit may be set in response to a positive pulse 40*a* at input terminal 42*a* or a positive pulse of current supplied by way of the differentiating capacitor 32*b* from second stage 10*b*.

A current $I_s \cong I_v$, the valley current of the diode, flows into the diode when the diode is biased in the high voltage region. The remaining current $I_r - I_s$ supplied by the current source flows into the base 18*a* of the transistor 12*a*. Assuming that a base current $I_b$ is sufficient to saturate the transistor 12*a*, as indicated in FIGURE 2, the additional current supplied to the base is excess base current, and is of substantial value for the conditions given. Excess base current results in minority charge carrier storage in the base region of the transistor. The greater the excess base current, the greater the charge storage and the longer it takes to bring the transistor out of saturation and turn off the transistor when the diode is next reset. The tunnel diode 20*a* may be switched back to the low voltage region by applying a negative pulse 50*a* at the junction 22*a* from pulse source 52. However, the base 18*a*-emitter 14*a* junction maintains a very low resistance until the transistor is brought out of saturation. Because of this low resistance, it is possible with some transistors to reset the tunnel diode to the low voltage state during the presence of the reset pulse, with a subsequent return to the high voltage state after the pulse is removed. This condition can be avoided by applying a very large reset pulse, but this places a large demand upon the power which the pulse source 52 must supply. This condition also may be avoided by connecting the resistor 38*a* in the circuit.

Consider now the operation of the bistable circuit when the resistor 38*a* is included. The load line for this condition is represented by the line 64. The values of the resistors 36*a* and 38*a* and the $+V_b$ voltage source are selected so that a total current $I_r$ is supplied at the junction 22*a* when the tunnel diode is in the low voltage stable state. When a positive pulse of sufficient amplitude is applied at junction 22*a*, the current through the diode increases above the peak value $I_p$, and the tunnel diode switches rapidly to the high voltage state. However, as the transistor 12*a* begins to turn on, the voltage at the collector 16*a* falls in a negative direction and less current is supplied through the resistor 38*a* to the junction 22*a*. For practical purposes, it may be assumed that little or no current flows through the resistor 38*a* when the transistor 12*a* is in saturation. The current supplied at the junction 22*a* then is less than $I_r$ by an amount equal to the current originally supplied through the resistor 38*a*, and the excess base current supplied to the transistor then is greatly reduced as compared to the excess base current without the resistor 38*a*. The current supplied through resistor 38*a* when transistor 12*a* is nonconducting is designated $$\frac{V_{c\ off}}{R_{38a}}$$

in FIGURE 2, where $V_{c\ off}$ is the collector 16*a* voltage when transistor 12*a* is nonconducting and $R_{38a}$ is the resistance of resistor 38*a*.

Figure 3:
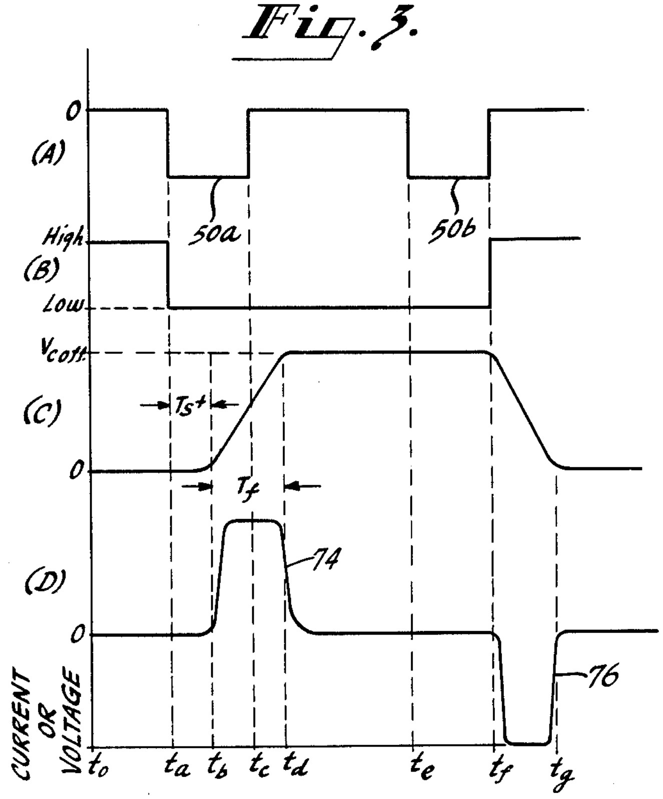
FIGURE 3 is a set of waveforms of voltage and current appearing at various points in the circuit of FIGURE 1.

Consider now the operation of the FIGURE 1 circuit and refer to the set of waveforms of FIGURE 3. The waveforms on lines A, B and C are waveforms of voltage appearing at correspondingly designated points in FIGURE 1. The waveform on line D is a waveform of current which flows through differentiating capacitor 32*a*.

Both of the negative resistance diodes 20*a*, 20*b* stabilize in the low voltage reset state when the circuit is energized initially. One of these diodes 20*a*, 20*b* is switched to the high voltage set state prior to the start of a counting operation. The pulses to be counted are supplied by the pulse source 52. Either the first diode 20*a* or the second diode 20*b* may be set by applying a positive input pulse at the set input terminal 42*a* or 42*b*, respectively. Assume that the first diode 20*a* is switched to the set state at a time prior to $t_o$ by an input pulse 40*a*. The diode 20*a* then is biased at the operating point 70 or 72 (FIGURE 2) and the voltage across the diode is high (FIGURE 3, line B). Transistor 12*a* is in saturation and the voltage at its collector 16*a* is close to ground potential (line C). No current flows through the differentiating capacitor 32*a* in the steady state condition. Negative resistance diode 20*b* in the second stage 10*b* is in the reset state at this time and transistor 12*b* is nonconducting.

A first pulse 50*a* to be counted is coupled to junctions 22*a* and 22*b* at a time $t_a$. This pulse 50*a* has a polarity and amplitude sufficient to switch a negative resistance diode from the set to the reset state. Accordingly, the pulse 50$a$ switches negative resistance diode 20$a$ to the low voltage reset state (line B). However, the transistor 12$a$ does not come out of saturation and turn-off instantaneously when the diode 20$a$ is reset. The times which are of significance in the turn-off of transistor 12$a$ are the delay time, the saturation delay time of the transistor 12$a$, and the fall time of this transistor. The delay time, which includes the switching time of the diode 20$a$, and the saturation delay time are lumped together in FIGURE 3 as a single time interval designated $T_s+$. The saturation delay time, also known as the minority carrier storage time, results from injected minority carriers being in the base region of the transistor 12$a$ at the moment when the pulse 50$a$ is applied. The length of storage time is essentially governed by the degree of saturation, as determined by the excess base current (FIGURE 2) and is also affected by the amplitude of the pulse 50$a$. In general, the saturation delay time is much greater than the delay time previously mentioned. The voltage at the collector 16$a$ remains substantially at ground potential during the saturation delay period from time $t_a$ to $t_b$ (FIGURE 3).

The fall time $T_f$ (FIGURE 3, line C) is determined in large part by the collector resistance, capacitance and voltage. If the value of $+V_c$ is much greater than the voltage $+V_{c\ off}$, which is the voltage at collector 16$a$ when transistor 12$a$ is nonconducting, then the fall time is approximately as follows:

$$T_f \approx \frac{V_{c\ off}}{V_c} R_{26a} C_T$$

where $R_{26a}$ is the resistance of collector resistor 26$a$ and $C_T$ is the total capacitance from collector 16$a$ to ground. This capacitance comprises, in the main, the capacitance of the differentiating capacitor 32$a$ and the capacitance from collector 16$a$ to base 18$a$. Accordingly, the fall time may be preselected by choosing a desired value of capacitance for the differentiating capacitor 32$a$. The total turn-off time of transistor 12$a$ is the sum of the saturation delay time and fall time, and is equal approximately to the period $t_a$ to $t_d$ (FIGURE 3). This turn-off time preferably is made equal for all of the stages by proper selection of the differentiating capacitors in the circuit design phase.

The current pulse 74 (FIGURE 3, line D) through the capacitor 32$a$ is used to switch the negative resistance diode 20$b$ to the high voltage set state and thereby transfer the binary "1" from the first stage 10$a$ to the second stage 10$b$. In order to accomplish this, the amplitude of this current pulse must either be greater than the pulse 50$a$ so as to override the pulse 50$a$, or else it must still be present after the pulse 50$a$ has terminated. This second method is accomplished by taking advantage of the turn-off time of the transistor 12$a$. As may be seen in FIGURE 3, the pulse 50$a$ (line A) terminates at a time $t_c$ during the turn-off period of the transistor 12$a$. The fall time $T_f$ of the transistor does not end until time $t_d$ (line C). Accordingly, that portion of the current pulse 74 (line D) during the period $t_c$ to $t_d$ is available to switch the diode 20$b$ of stage 10$b$ to the high voltage state.

The next occurring pulse 50$b$, supplied by pulse source 52 at $t_e$, resets the negative resistance diode 20$b$ in the second stage 10$b$ and causes transistor 12$b$ to turn off. This action is the same as that described hereinabove for the first stage 10$a$. That is to say, the pulse 50$b$ is shorter than the turn-off time of the transistor 12$b$, whereby a current flows through the differentiating capacitor 32$b$ and switches diode 20$a$ in first stage 10$a$ to the high voltage state at $t_f$ at the termination of the pulse 50$b$. Transistor 12$a$ begins to turn on at $t_f$ and is fully on at $t_g$. The period $t_f$ to $t_g$ is the transistor 12$a$ rise time. During this period, the collector 16$a$ voltage change is differentiated, and a negative pulse 76 of current flows through the differentiating capacitor 32$a$. This pulse has no switching effect on the diode 20$b$ of the second stage 10$b$ since the diode 20$b$ was previously reset by the pulse 50$b$ from source 52.

Pulses 50$a$ and 50$b$ may be characterized as pulses having a polarity and amplitude to switch a negative resistance diode from the set state to the reset state, and having a duration which is shorter than the turn-off time of all of the transistors.

Figure 4:
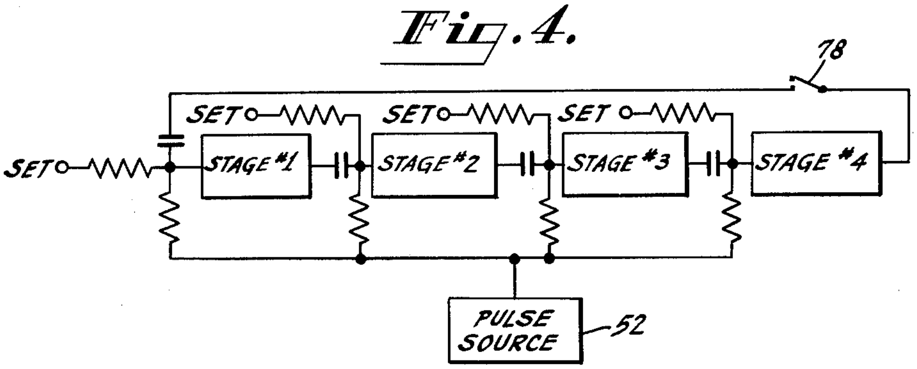
FIGURE 4 is a diagram, partly in schematic and partly in block form, of a multistage sequential switching arrangement embodying the invention.

It is believed apparent that a counter having any number of stages, like those described, may be cascaded, as shown in block form in FIGURE 4. Moreover, the counter may be operated as either a "closed loop" or ring counter, or as an "open loop" counter, depending upon the setting of the switch 78 (FIGURE 4). The arrangement also may be used to shift a pattern of binary "1's" and "0's" in response to signals from the pulse source 52. A restriction imposed on the latter type of operation is that two adjacent stages must not be in the set state at the same time. The reason for this is that the transistor of a set stage might not turn off if a "1" is transferred from the previous stage, and there may then be no current passed through the differentiating capacitor to the next succeeding stage.

By way of example only, and not meaning to be limited thereto, the values of the various components and voltages in the FIGURE 1 circuit may be as follows when the negative resistance diode is a ten milliampere tunnel diode:

Resistors:

| | |
|---|---|
| 26$a$ | 820 ohms. |
| 36$a$ | 3.75K ohms. |
| 38$a$ | 750 ohms. |
| 44$a$ | 1K ohm. |

(1K ohm=1000 ohms).

Voltages:

| | |
|---|---|
| $V_b$ | 15.5 volts. |
| $V_c$ | 15.5 volts. |
| $V_{c1}$ | 3 vots. |
| Diode 28$a$ | MA4121. |
| Capacitor 32$a$ | 6.8 $\mu\mu$farads. |

What is claimed is:

1. The combination comprising: a plurality of bistable stages connected in cascade, each of said stages including a transistor having a base, an emitter and a collector, a negative resistance diode connected between said base and said emitter, means connected to said diode for biasing said diode bistably and for biasing said transistor into saturation when said diode is biased in a first of its two stable states, said transistor having a turn-off time including a saturation delay time and a fall time when said diode is switched from the first stable state to the second stable state; a plurality of capacitors each being connected between the collector of a different said transistor and the base of the transistor in the next succeeding stage; a source of signals each having an amplitude and a polarity to switch each of the diodes from the first stable state to the second stable state and a duration which is shorter than the turn-off time of each transistor; and means for coupling said source to the base of each said transistor.

2. The combination comprising: a plurality of bistable stages connected in cascade, each of said stages including a transistor having a base, an emitter and a collector, a negative resistance diode connected between said base and said emitter, means connected to said diode for biasing said diode bistably and for biasing said transistor into saturation when said diode is biased in a first of its two stable states, said transistor having a turn-off time including a saturation delay time and a fall time when said diode is switched from the first stable state to the second stable state; a plurality of capacitors each being connected between the collector of a different said transistor and the base of the transistor in the next succeeding stage; means for applying a signal at the base of a selected one of said stages to switch the diode of that stage to the first stable state; a source of signals each having an amplitude and polarity to switch each of the diodes from the first stable state to the second stable state and a duration which is shorter than the turn-off time of each said transistor; and means for coupling said source to the base of each said transistor.

3. The combination comprising: a plurality of bistable stages connected in cascade, each of said stages including a transistor having a base, an emitter and a collector, means connecting said emitter to a point of reference potential, a negative resistance diode connected between said base and said point of reference potential and having a volt-ampere characteristic defined by two positive resistance regions separated by a region of negative resistance, means connected to said diode for biasing said diode bistably and for biasing said transistor into saturation when the diode is in a first stable state, said transistor having a turn-off time including a saturation delay time and a fall time; a plurality of capacitors each connected between the collector of a transistor in a different stage and the base of the transistor in the next succeeding state; and means for coupling a signal to the base in each said stage, said signal having an amplitude and polarity to switch all of said diodes to the second stable state and a duration shorter than the turn-off time of each said transistor.

4. The combination comprising: a plurality of bistable stages connected in cascade, each of said stages including a transistor having a base, an emitter and a collector, means connecting said emitter to a point of reference potential, a negative resistance diode connected between said base and said point of reference potential and having a volt-ampere characteristic defined by two positive resistance regions separated by a region of negative resistance, means connected to said diode for biasing said diode bistably and for biasing said transistor into saturation when the diode is in a first stable state, said transistor having a turn-off time including a saturation delay time and a fall time; a plurality of capacitors each connected between the collector of a transistor in a different stage and the base of the transistor in the next succeeding stage; means for coupling a signal to the diode in a selected one of said stages to switch that diode to the first stable state; and means for coupling to each said diode a signal having an amplitude and polarity to switch any diode from the first to the second stable state and a duration which is shorter than the turn-off time of each said transistor.

5. The combination comprising: a plurality of bistable stages connected in cascade, each of said stages including a transistor having a base, an emitter and a collector, means connecting said emitter to a point of reference potential, means for connecting a resistor between said collector and a point of operating potential, a tunnel diode connected between said base and said point of reference potential, a resistor connected between said collector and said base, means connected to said diode for biasing said diode bistably and for biasing said transistor into saturation when the diode is in a first of its stable states, said transistor having a turn-off time including a saturation delay time and a fall time; means for supplying to a selected said tunnel diode a signal having an amplitude and polarity to switch that tunnel diode to the first stable state; a plurality of capacitors each connected between the collector of a different said transistor and the base of the transistor in the next succeeding stage; a source of pulses having an amplitude and polarity to switch a tunnel diode from the first stable state to the second stable state, and a duration which is shorter than the turn-off time of each said transistor; and means for coupling said source of pulses to each said tunnel diode.

6. The combination comprising: a plurality of bistable stages connected in cascade, each of said stages including a transistor having a base, an emitter and a collector, means connecting said emitter to a point of reference potential, means for connecting a resistor between said collector and a potential source, a tunnel diode connected between said base and said point of reference potential, a resistor connected between said collector and said base, means connected to said diode for biasing said diode bistably and for biasing said transistor into saturation when the diode is in a first of its stable states, said transistor having a turn-off time including a saturation delay time and a fall time; a plurality of coupling capacitors each connected between the collector of a different said transistor and the base of the transistor in the next succeeding stage, one of said capacitors being connected between the collector of the transistor in the last stage and the base of the transistor in the first stage; output means connected at each said collector; a source of pulses having an amplitude and polarity to switch a tunnel diode from the first stable state to the second stable state and a duration which is shorter than the turn-off time of each said transistor; and means for coupling said source of pulses to each said tunnel diode.

7. The combination comprising: a plurality of bistable stages connected in cascade, each of said stages including a transistor having a base, an emitter and a collector, means connecting said emitter to a point of reference potential, means for connecting a resistor between said collector and a point of operating potential, a tunnel diode connected between said base and said point of reference potential, means connected to said diode for biasing said diode bistably and for biasing said transistor into saturation when the diode is in a first of its stable states, said transistor having a turn-off time including a saturation delay time and a fall time; a plurality of capacitors each connected between the collector of a different said transistor and the base of the transistor in the next succeeding stage; a source of pulses having an amplitude and polarity to switch a tunnel diode from the first stable state to the second stable state, and a duration which is shorter than the turn-off time of each said transistor; and means for coupling said source of pulses to each said tunnel diode.

References Cited by the Examiner

UNITED STATES PATENTS 3,121,176 2/1964 Burns -------------- 307—88.5

ARTHUR GAUSS, *Primary Examiner.*